(12) United States Patent
Zou et al.

(10) Patent No.: US 12,087,829 B2
(45) Date of Patent: Sep. 10, 2024

(54) SEMICONDUCTOR STRUCTURE AND ITS FABRICATING METHOD

(71) Applicant: CHANGXIN MEMORY TECHNOLOGIES, INC., Hefei (CN)

(72) Inventors: Bing Zou, Hefei (CN); Cheng Yeh Hsu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 381 days.

(21) Appl. No.: 17/500,089

(22) Filed: Oct. 13, 2021

(65) Prior Publication Data

US 2022/0037481 A1 Feb. 3, 2022

Related U.S. Application Data

(63) Continuation of application No. PCT/CN2021/095612, filed on May 24, 2021.

(30) Foreign Application Priority Data

Jun. 5, 2020 (CN) .......................... 202010506798.2

(51) Int. Cl.
  *H01L 29/40* (2006.01)
  *H01L 29/417* (2006.01)
  (Continued)

(52) U.S. Cl.
  CPC ...... *H01L 29/401* (2013.01); *H01L 29/41766* (2013.01); *H01L 29/4236* (2013.01);
  (Continued)

(58) Field of Classification Search
  CPC ......... H01L 29/06; H01L 29/40; H01L 29/66; H01L 29/78; H01L 29/417; H01L 29/401;
  (Continued)

(56) References Cited

U.S. PATENT DOCUMENTS

| 2004/0036114 A1 | 2/2004 | Taylor |
| 2008/0194068 A1 | 8/2008 | Temmler |

(Continued)

FOREIGN PATENT DOCUMENTS

| CN | 105374688 A | 3/2016 |
| CN | 110911407 A | 3/2020 |
| CN | 111063722 A | 4/2020 |

OTHER PUBLICATIONS

ISR_for_International_Application_PCTCN2021095612 mailed Aug. 23, 2021.

(Continued)

*Primary Examiner* — Chuong A Luu
(74) *Attorney, Agent, or Firm* — Syncoda LLC; Feng Ma

(57) ABSTRACT

Embodiments of the present application provide a semiconductor structure and its fabricating method, and a semiconductor memory. The method of fabricating a semiconductor structure comprises providing a substrate and performing ion implantation on the substrate to form an active area, forming a gate groove on surface of the substrate, measuring depth of the gate groove, and performing ion implantation compensation, if the depth of the gate groove meets a preset condition, on the substrate according to the depth of the gate groove, and forming an ion compensation region in the active area at one side of the gate groove.

5 Claims, 9 Drawing Sheets

(51) Int. Cl.
    *H01L 29/423*     (2006.01)
    *H01L 29/66*     (2006.01)
    *H10B 99/00*     (2023.01)
    *H01L 21/265*     (2006.01)
    *H01L 21/66*     (2006.01)

(52) U.S. Cl.
    CPC ....... *H01L 29/66621* (2013.01); *H10B 99/00* (2023.02); *H01L 21/26513* (2013.01); *H01L 22/12* (2013.01)

(58) Field of Classification Search
    CPC .............. H01L 29/423; H01L 29/0607; H01L 29/0684; H01L 29/4236; H01L 29/66621; H01L 29/41766; H01L 21/265; H01L 21/26513; H01L 21/8234; H01L 22/12; H01L 27/105; H01L 27/088; H01L 27/1052; H10B 12/00; H10B 12/01; H10B 12/485; H10B 12/488; H10B 99/00

USPC ....................................................... 257/330
    See application file for complete search history.

(56) References Cited

U.S. PATENT DOCUMENTS

| | | |
|---|---|---|
| 2017/0373185 A1 | 12/2017 | Yilmaz et al. |
| 2019/0385852 A1* | 12/2019 | Jelinek .............. H01L 21/26513 |
| 2020/0303534 A1* | 9/2020 | Ram .................... H01L 29/7786 |
| 2022/0344476 A1* | 10/2022 | Chan ..................... H01S 5/0216 |

OTHER PUBLICATIONS

English translation of Written Opinion of the International Search Authority in the international application No. PCT/CN2021/095612, mailed on Aug. 24, 2021.

* cited by examiner threshold voltage/V depth of gate groove/nm

SEMICONDUCTOR STRUCTURE AND ITS FABRICATING METHOD

CROSS-REFERENCE TO RELATED APPLICATIONS

This application is a continuation of International Patent Application No. PCT/CN2021/095612 filed on May 24, 2021, which claims priority to Chinese Patent Application No. 202010506798.2 filed on Jun. 5, 2020. The entire contents of the aforementioned patent applications are herein incorporated by reference.

TECHNICAL FIELD

The present application relates to the field of semiconductor technology, and more particularly to a semiconductor structure and its fabricating method.

BACKGROUND

Buried wordlines refer to wordlines that are buried inside the semiconductor substrate, and this can markedly reduce parasitic capacitance between wordlines and bitlines, greatly improve reliability of voltage readout operation of semiconductor devices, and provides a new choice for increasing integration density of semiconductor devices.

In the relevant prior-art technology, before the gate groove of a buried transistor is fabricated, its ion implantation has already been completed, that is to say, parameters of the implanted ions have been determined, but the depth of the gate groove might be possibly varied in the subsequent fabrication process, so that variation occurs in the threshold voltage, thus causing deterioration of performance of the buried transistor, hence leading to deterioration of acceptance rate or reliability of semiconductor memories.

SUMMARY

Embodiments of the present application propose a semiconductor structure and its fabricating method, so as to avoid deterioration in performance of the transistor caused by depth variation of the gate groove, and to improve performance of the semiconductor memory.

According to the first aspect, an embodiment of the present application provides a method of fabricating a semiconductor structure, which method comprises: providing a substrate and performing ion implantation on the substrate to form an active area; forming a gate groove on surface of the substrate; measuring depth of the gate groove; and forming an ion compensation region in the active area at one side of the gate groove if the depth of the gate groove meets a preset condition.

According to the second aspect, an embodiment of the present application provides a semiconductor structure, obtained by fabrication using the method of fabricating a semiconductor structure provided by the first aspect, and the structure comprises: a substrate, a gate groove, and an ion compensation region; and an active area, disposed in the substrate; wherein the ion compensation region is located in the active area at one side of the gate groove whose depth meets a preset condition.

According to the third aspect, an embodiment of the present application provides a semiconductor memory that comprises the semiconductor structure provided by the second aspect.

BRIEF DESCRIPTION OF DRAWINGS

In order to more clearly describe the technical solutions of the exemplary embodiments of the present application, brief introduction is made below to the accompanying drawings that are necessary to describe the embodiments. Apparently, the introduced accompanying drawings are merely the drawings directed to partial embodiments to be described in the present application, rather than the entire drawings. Persons ordinarily skilled in the art may acquire other drawings from these accompanying drawings without spending creative effort in the process.

DESCRIPTION OF EMBODIMENTS

The present application will be described in greater detail below with reference to the accompanying drawings and the embodiments. As understandable, the specific embodiments described in this context are merely directed to explain the present application, rather than to restrict the present application. As should be additionally noted, to facilitate description, the accompanying drawings merely show partial structures relevant to the present application, rather than the entire structures.

Figure 1:
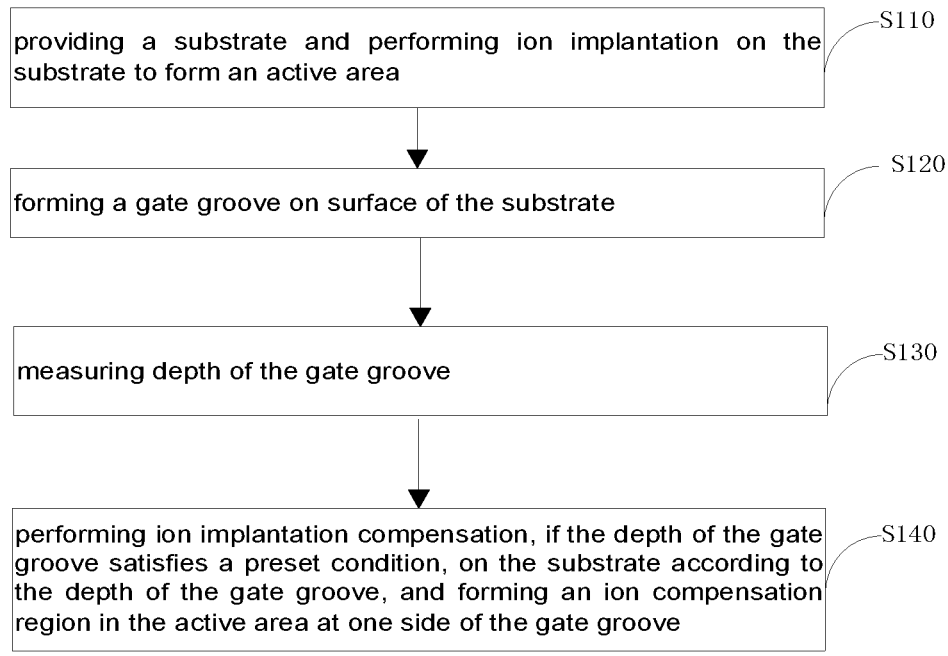
FIG. 1 is a flowchart illustrating the method of fabricating a semiconductor structure provided in an embodiment of the present application.

FIG. 1 is a flowchart illustrating the method of fabricating a semiconductor structure provided in an embodiment of the present application, and FIGS. 2-5 are diagrams schematically illustrating the process of the various steps in the method of fabricating a semiconductor structure provided in an embodiment of the present application. As shown in FIG. 1, the following specific steps are included.

S110: providing a substrate and performing ion implantation on the substrate to form an active area.

Figure 2:
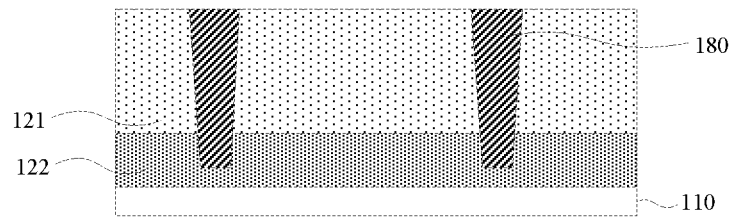
FIGS. 2-5 are diagrams schematically illustrating the process of the various steps in the method of fabricating a semiconductor structure provided in an embodiment of the present application.

Exemplarily, as shown in FIG. 2, with NMOS (N-Metal-Oxide-Semiconductor) as an example, N-type ions are implanted inside the substrate 110 to form an active area 121 having a certain depth, acceptor impurities are implanted into the active area 121 to form a channel modulation doping area 122, so the voltage generated by the channel modulation doping area 122 exerts a control function on the density of electrically conductive ions in the active area 121. In other embodiments, it is also possible to implant P-type ions inside the substrate to form an active area, and to implant donor impurities to form a channel modulation doping area. As should be noted, the substrate 110 may use, but is not restricted to use, such a common semiconductor substrate material as silicon, germanium, germanium-silicon, etc., and the type of the implanted ions can be selected according to actual requirement.

S120: forming a gate groove on surface of the substrate.

Figure 3:
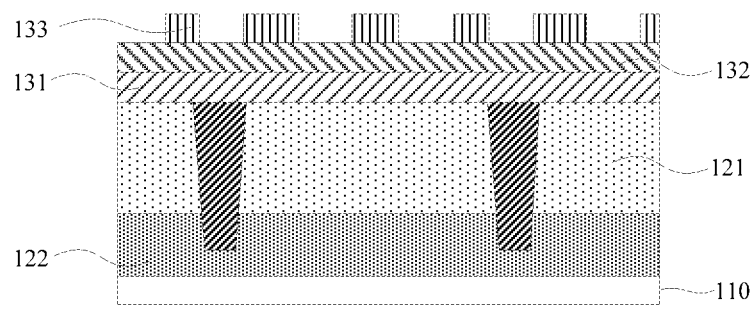

In some embodiments, referring to FIG. 3, on the surface of the substrate 10 is deposited and formed a substrate protective layer 131, on the surface of the side of the substrate protective layer 131 departing from the substrate 110 is deposited and formed a hard mask layer 132, a photoresist material is covered on the surface of the side of the hard mask layer 132 departing from the substrate 110 to form a first photoresist layer 133, exposure is performed by means of the mask plate of the gate groove, and patterns of the gate groove are formed on the first photoresist layer 133.

Figure 4:
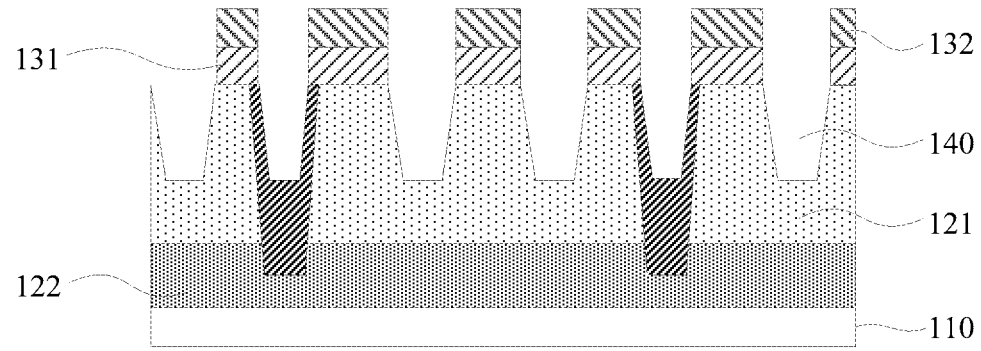

Referring to FIG. 4, the first photoresist layer 133, the hard mask layer 132 and the substrate protective layer 131 together serve as a mask, a plurality of gate grooves 140 are etched and formed on the surface of the substrate 110, the first photoresist layer 133 is removed, and source and drain areas are formed at two sides of the gate grooves 140. The material of the substrate protective layer 131 is selected from one of the group consisting of silicon oxide, silicon nitride, silicon carbide, silicon oxynitride, silicon oxycarbide, silicon carbonitride oxide and boron oxide, and the material of the hard mask layer 132 is selected from one of the group consisting of silicon oxide, silicon nitride, silicon carbide, silicon oxynitride, silicon oxycarbide, silicon carbonitride oxide and boron oxide. Exemplarily, the material of the substrate protective layer 131 is selected from silicon oxide, and the material of the hard mask layer 132 is selected from silicon nitride.

S130: measuring depth of the gate groove.

S140: performing ion implantation compensation, if the depth of the gate groove meets a preset condition, on the substrate according to the depth of the gate groove, and forming an ion compensation region in the active area at one side of the gate groove.

Figure 5:
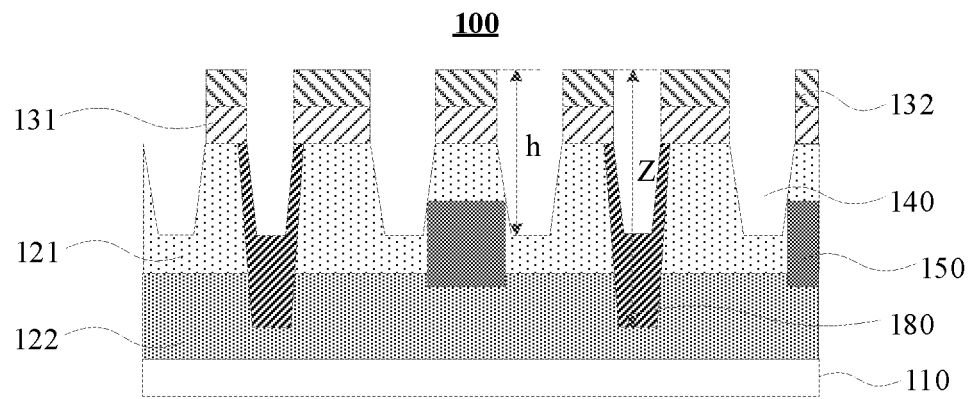

In some embodiments, as shown in FIG. 5, measurement is done to obtain a depth h of the gate groove 140; if the depth h of the gate groove 140 meets a preset condition, this indicates that the depth h of the gate groove 140 is relatively short, that is to say, the gate groove 140 is relatively far distanced from the channel modulation doping area 122. The acceptor impurities in the channel modulation doping area 122 can control the density of moveable charges in the active area 121; if the gate groove 140 is relatively far distanced from the channel modulation doping area 122, the control function of the channel modulation doping area 122 on the density of moveable charges near the gate groove 140 will be lowered, and it will be more easy for charges in the source and drain areas at one side of the gate groove 140 to penetrate through the gate groove 140 and arrive at the source and drain areas at another side, that is to say, it will be more easy for the source and drain areas at two sides of the gate groove 140 to be conducted, thus leading to reduction in the conduction voltage of the source and drain areas, namely reduction in the threshold voltage of the semiconductor structure. However, reduction in the threshold voltage would affect the performance of the semiconductor structure. Specific analysis will be made below.

Figure 6:
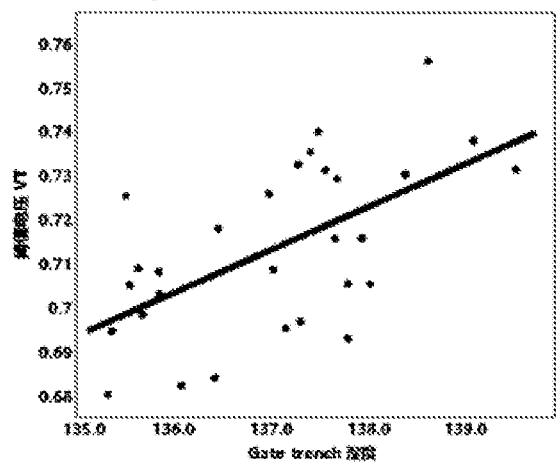
FIG. 6 is a diagram schematically illustrating the relation between the depth of the gate groove and the threshold voltage provided in an embodiment of the present application.
Figure 7:
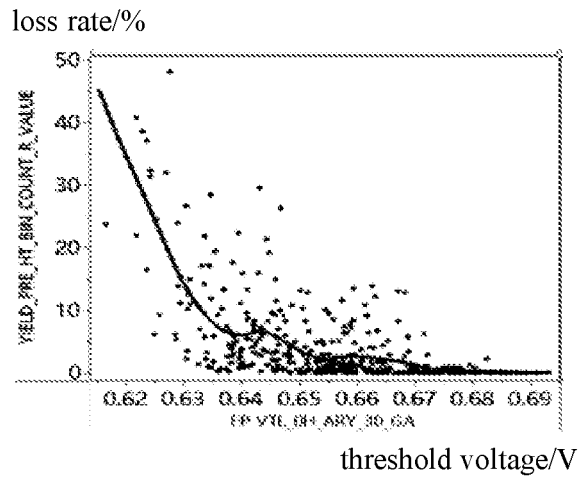
FIG. 7 is a diagram schematically illustrating the relation between the threshold voltage and the acceptance rate provided in an embodiment of the present application.

Exemplarily, FIG. 6 is a diagram schematically illustrating the relation between the depth of the gate groove and the threshold voltage provided in an embodiment of the present application, and FIG. 7 is a diagram schematically illustrating the relation between the threshold voltage and the acceptance rate provided in an embodiment of the present application. Referring to FIGS. 6 and 7 in combination, the depth of the gate groove varies for every 1 nm, the threshold voltage of the semiconductor structure will vary for 10 mV; when the threshold voltage of the semiconductor structure is less than 670 mV, the acceptance rate of the semiconductor structure will be markedly lowered, so it must be ensured that the threshold voltage Vth of the semiconductor structure is greater than 670 mV in order to guarantee the performance of the semiconductor structure.

In the embodiments of the present application, ion implantation compensation is performed on the substrate 110 according to the depth h of the gate groove 140, and an ion compensation region 150 is formed in the active area 121 at one side of the gate groove 140; as shown in FIG. 5, the ion compensation region 150 functions the same as the channel modulation doping area 122, both to exert control function on the density of moveable charges near the gate groove 140, so as to make it more difficult for source and drain areas at the two sides of the gate groove 140 to be conducted, thus enhancing the conduction voltage of the source and drain regions, namely the threshold voltage, compensating reduction in threshold voltage caused by an unduly shallow depth h of the gate groove 140, avoiding deterioration of performance of the semiconductor structure caused by variation in the depth h of the gate groove 140, and improving performance of the semiconductor memory.

Figure 8:
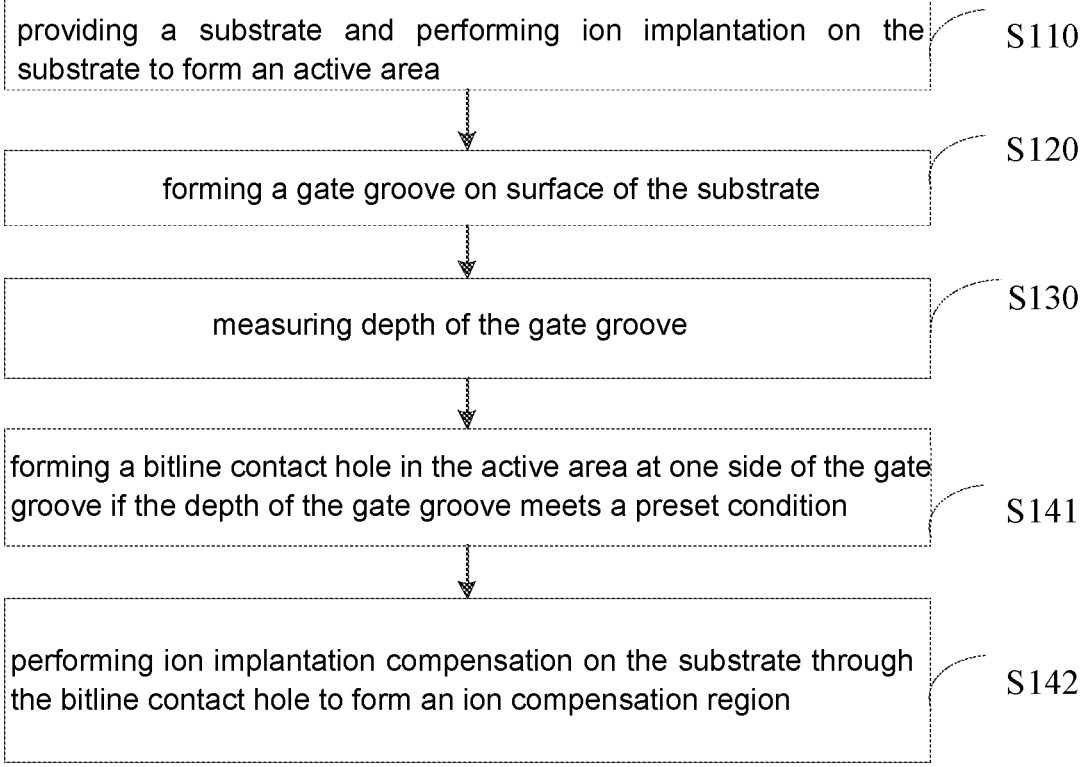
FIG. 8 is a flowchart illustrating another method of fabricating a semiconductor structure provided in an embodiment of the present application.

In addition, FIG. 8 is a flowchart illustrating another method of fabricating a semiconductor structure provided in an embodiment of the present application. As shown in FIG. 8, specific steps thereof include the following.

S110: providing a substrate and performing ion implantation on the substrate to form an active area.

S120: forming a gate groove on surface of the substrate.

S130: measuring depth of the gate groove.

S141: forming a bitline contact hole in the active area at one side of the gate groove if the depth of the gate groove meets a preset condition.

S142: performing ion implantation compensation on the substrate through the bitline contact hole to form an ion compensation region.

Figure 9:
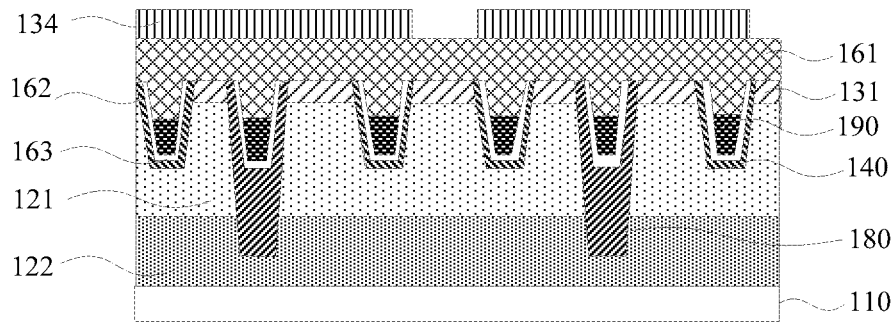
FIGS. 9 and 10 are diagrams schematically illustrating the process of the various steps in a method of fabricating an ion compensation region provided in an embodiment of the present application.
Figure 10:
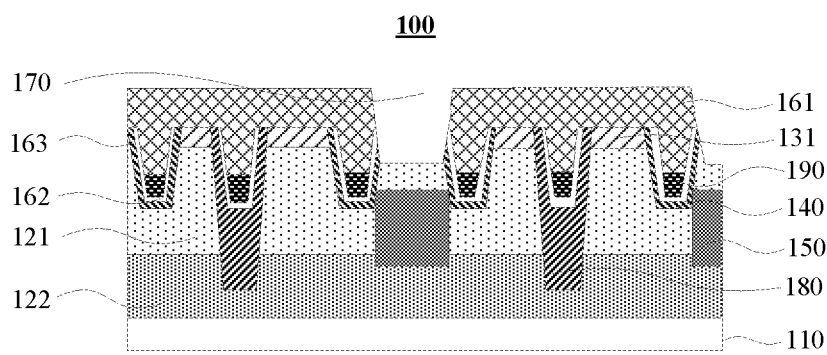

In some embodiments, FIGS. 9 and 10 are diagrams schematically illustrating the process of the various steps in a method of fabricating an ion compensation region provided in an embodiment of the present application. Referring to FIG. 9, when the depth of the gate groove 140 meets the preset condition, a second photoresist layer 134 is formed at one side of a protective layer 160 departing from the substrate 110, exposure is performed by means of the mask plate of the bitline contact hole, and patterns of the bitline contact hole are formed on the second photoresist layer 134.

Referring to FIG. 10, the second photoresist layer 134, the diffusion barrier layer 162, the protective layer 161 and the substrate 110 together serve as a mask, a plurality of bitline contact holes 170 are etched and formed on the surface of the substrate 110, the second photoresist layer 134 is removed, ion implantation compensation is performed on the substrate 110 through the bitline contact holes 170, and the implanted ions diffuse inside the substrate 110 to form an ion compensation region 150 having a certain depth. Since ion implantation should be performed on the surface of the substrate 110, whereby it is ensured that the implanted ions form the ion compensation region 150 in the active area 121, so it is required to utilize such process as etching to expose the surface of the substrate 110, so as to perform implantation of the compensation ions; in the embodiments of the present application compensation ion implantation is performed through the bitline contact holes 170, and no additional process is required, thus simplifying the process.

Figure 11:
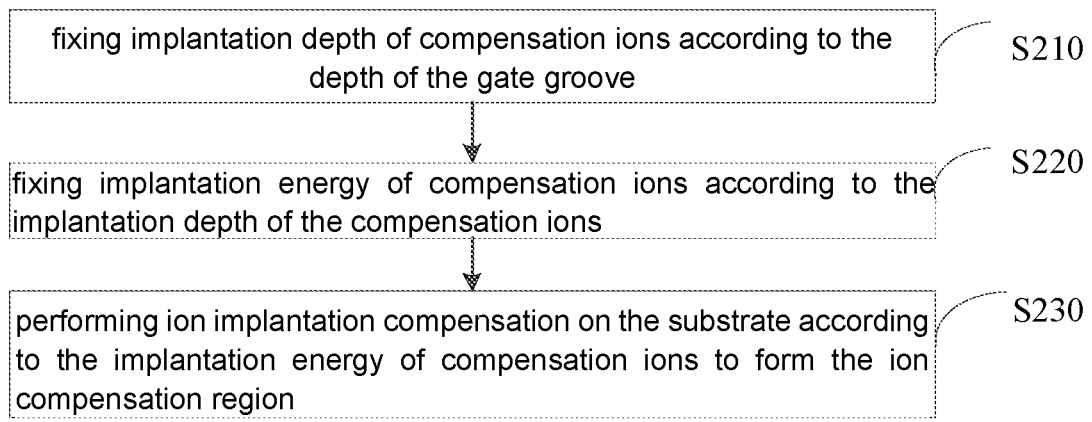
FIG. 11 is a flowchart schematically illustrating an ion implantation compensating method provided by an embodiment of the present application.

Moreover, FIG. 11 is a flowchart schematically illustrating an ion implantation compensating method provided by an embodiment of the present application. As shown in FIG. 11, specific steps include the following.

S210: fixing implantation depth of compensation ions according to the depth of the gate groove.

Figure 12:
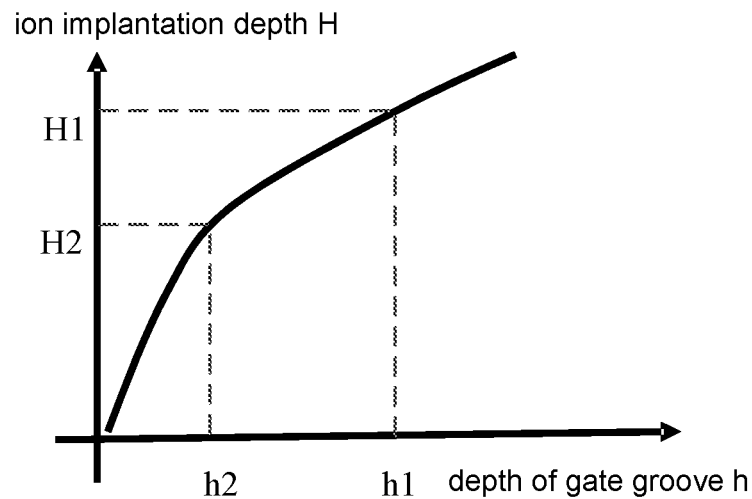
FIG. 12 is a diagram schematically illustrating the relation between the depth of the gate groove and the ion implantation depth provided in an embodiment of the present application.

In some embodiments, FIG. 12 is a diagram schematically illustrating the relation between the depth of the gate groove and the ion implantation depth provided in an embodiment of the present application. As shown in FIG. 12, the relation between the measured value of the depth h of the gate groove and the ion implantation depth H is acquired through a great quantity of experimental data, when the measured value of the depth of the gate groove is h1, the corresponding ion implantation depth will be H1.

S220: fixing implantation energy of compensation ions according to the implantation depth of the compensation ions.

Figure 13:
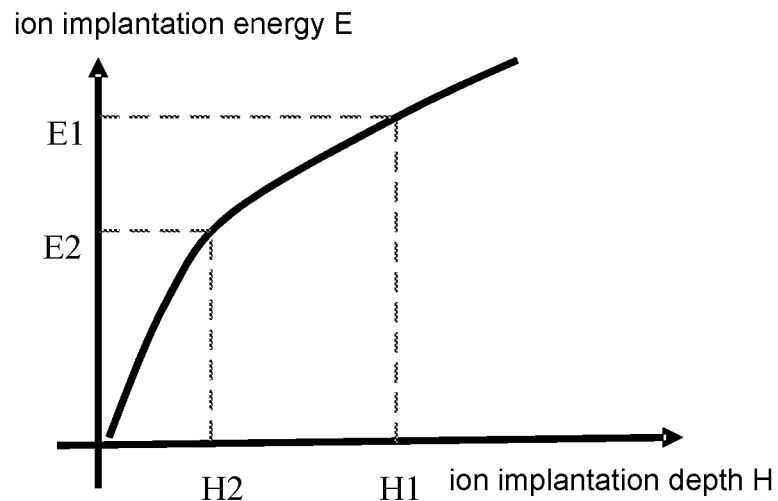
FIG. 13 is a diagram schematically illustrating the relation between the ion implantation depth and the ion implantation energy provided in an embodiment of the present application.

In some embodiments, FIG. 13 is a diagram schematically illustrating the relation between the ion implantation depth and the ion implantation energy provided in an embodiment of the present application. In the actual process, the implantation depth H of ions is decided by the implantation energy E of ions, and the relation between the implantation depth H of ions and the implantation energy E of ions is acquired from published data, as shown in FIG. 13, when the ion implantation depth is H1, the corresponding ion implantation energy will be E1, it is therefore possible to determine that the implantation energy of ions is E1 according to the depth h1 of the gate groove.

S240: performing ion implantation compensation on the substrate according to the implantation energy of compensation ions to form an ion compensation region.

Exemplarily, the measured value of the depth of the gate groove is h1, and the implantation energy E1 of the compensation ions can be determined; ion implantation compensation is performed on the substrate with the implantation energy E1 of the compensation ions serving as a processing parameter, so that an ion compensation region is formed in the active area at one side of the gate groove to compensate the threshold voltage.

Moreover, the implantation dose D of the compensation ions can be inferred from the relation between the threshold voltage or the acceptance rate and the ion implantation dose through a great quantity of experimental data, and then obtained through corresponding computation according to the threshold voltage required to be compensated.

Figure 14:
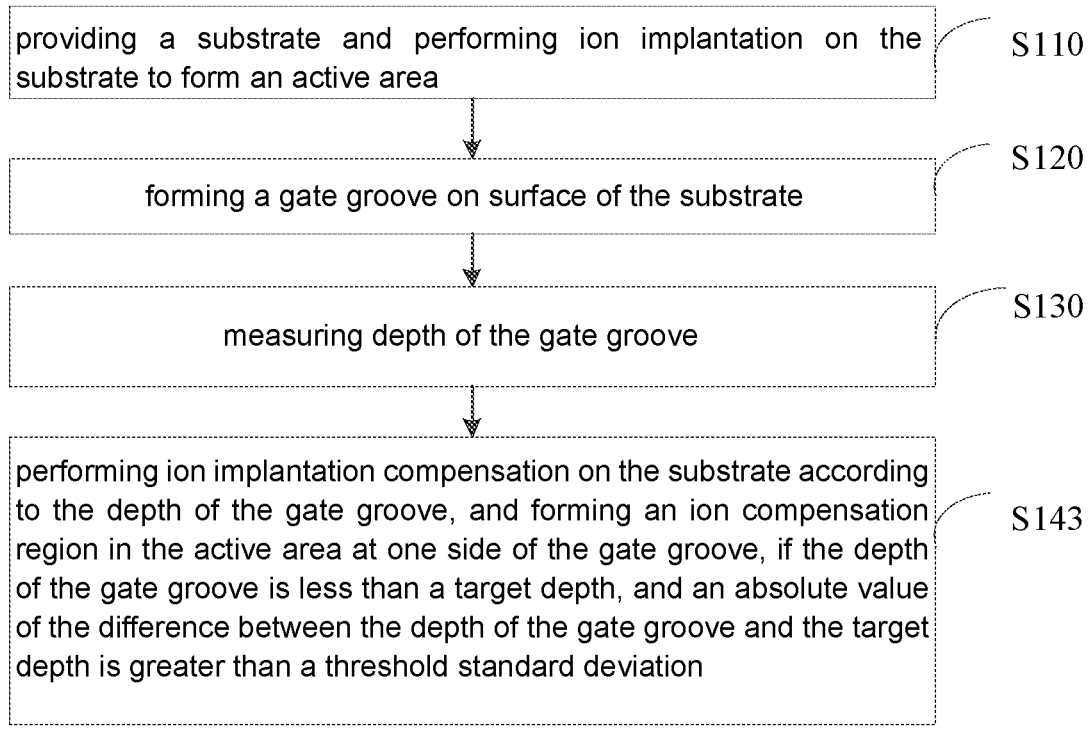
FIG. 14 is a flowchart illustrating yet another method of fabricating a semiconductor structure provided in an embodiment of the present application.

In addition, FIG. 14 is a flowchart illustrating yet another method of fabricating a semiconductor structure provided in an embodiment of the present application. As shown in FIG. 14, specific steps thereof include the following.

S110: providing a substrate and performing ion implantation on the substrate to form an active area.

S120: forming a gate groove on surface of the substrate.

S130: measuring depth of the gate groove.

S143: performing ion implantation compensation on the substrate according to the depth of the gate groove, and forming an ion compensation region in the active area at one side of the gate groove, if the depth of the gate groove meets a preset condition and is less than a target depth, and an absolute value of the difference between the depth of the gate groove and the target depth is greater than a threshold standard deviation.

The threshold standard deviation is determined according to a result of statistics about depths of gate grooves of plural semiconductor structures made with the target depth as a processing parameter.

In some embodiments, h2 is taken as a processing parameter to fabricate a semiconductor structure, then target depth is h2; due to such factors influencing fabrication as processing equipment and processing environment etc., the depth h of the gate groove of the fabricated semiconductor structure might be greater than the target depth h2 and might as well be less than the target depth h2; when the depth h of the gate groove lies within a certain deviation range relative to the target depth h2, performance of the semiconductor structure will not be affected. A threshold standard deviation is calculated and obtained according to a result of statistics about depths h of gate grooves by measuring the depths h of gate grooves of a plurality of normally performing semiconductor structures. Exemplarily, N number of semiconductor structures normally fabricated with target depth h2 as a processing parameter is selected, depths h1 of gate grooves of the N number of normally performing semiconductor structures are measured and obtained, ($1 \leq i \leq N$), an average value $h_{avg}$ and standard deviation s of depths h1 of N number of gate grooves are calculated, the average value $h_{avg}$ serves as a standard average SH, and the standard deviation s serves as a threshold standard deviation $DS_{th}$, in other words, when the absolute value of the difference between the depth h of the gate groove of a semiconductor structure and the standard average value SH lies within the range of the threshold standard deviation $DS_{th}$, it is considered that no abnormality occurs in the depth of the gate groove of this semiconductor structure. As should be noted, the method of fixing the standard average value and the threshold standard deviation is merely exemplarily described in the embodiment of the present application, and the present application makes no specific restriction thereto.

When the depth h of the gate groove is less than the target depth h2, the gate groove is distanced relatively far from the channel modulation doping area 122, there is a risk of reduction in the threshold voltage, and it is required to further ascertain whether the depth h of the gate groove is so small as to affect the threshold voltage of the semiconductor structure; when the absolute value of the difference between the depth h of the gate groove of the semiconductor structure and the standard average value SH is greater than the threshold standard deviation $DS_{th}$, this indicates that abnormality occurs in the groove depth of the semiconductor structure, and it is therefore required to perform compensation through implantation of compensation ions.

Figure 15:
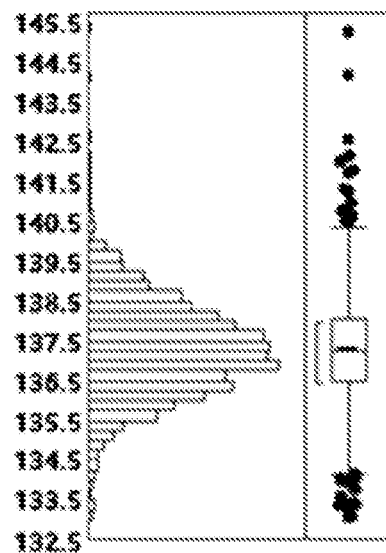
FIG. 15 is a diagram schematically illustrating the result of statistics about depths of gate grooves of plural semiconductor structures provided in an embodiment of the present application.

Exemplarily, FIG. 15 is a diagram schematically illustrating the result of statistics about depths of gate grooves of plural semiconductor structures provided in an embodiment of the present application. As shown in FIG. 15, plural semiconductor structures are selected, depths of their gate grooves are measured to acquire a statistics result, and computation is made to obtain an average value of the depths of the gate grooves of the semiconductor structures as 137 nm, and to obtain a threshold standard deviation as 1.4 nm; within the range of twice the threshold standard deviation, there would be an error of 3% in the threshold voltage of the semiconductor structure; within the range of thrice the threshold standard deviation, there would be at least an error of 10% in the threshold voltage of the semiconductor structure. By compensating the threshold voltage through the aforementioned method, the error of the threshold voltage of the finally obtained semiconductor structure will be less than 3%.

Figure 16:
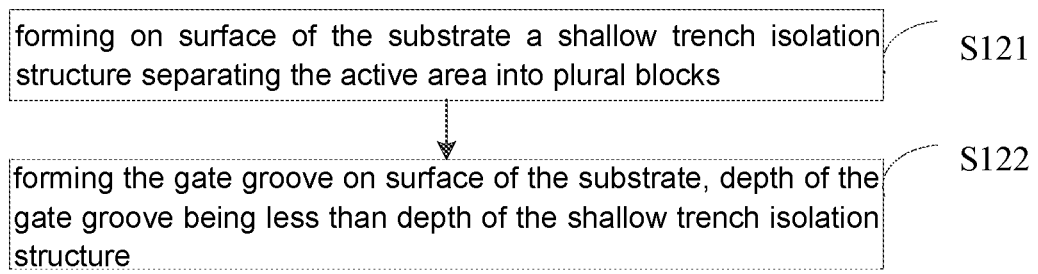
FIG. 16 is a flowchart illustrating a method of fabricating a gate groove provided in an embodiment of the present application.

In addition, FIG. 16 is a flowchart illustrating a method of fabricating a gate groove provided in an embodiment of the present application. As shown in FIG. 16, the following specific steps are included.

S121: forming on surface of the substrate a shallow trench isolation structure separating the active area into plural blocks.

S122: forming the gate groove on surface of the substrate, depth of the gate groove being less than depth of the shallow trench isolation structure.

In some embodiments, as shown in FIG. 5, on the surface of the substrate 110 are respectively formed a shallow trench isolation structure 180 and a gate groove 140, the shallow trench isolation structure 180 separates the active area 121, and the depth Z of the shallow trench isolation structure 180 is greater than the depth h of the gate groove 140, to realize separation of the semiconductor structure by the shallow trench isolation structure 180, and ensure independent operation of each semiconductor structure, without being affected by variation in voltage current of the adjacent semiconductor structure.

Figure 17:
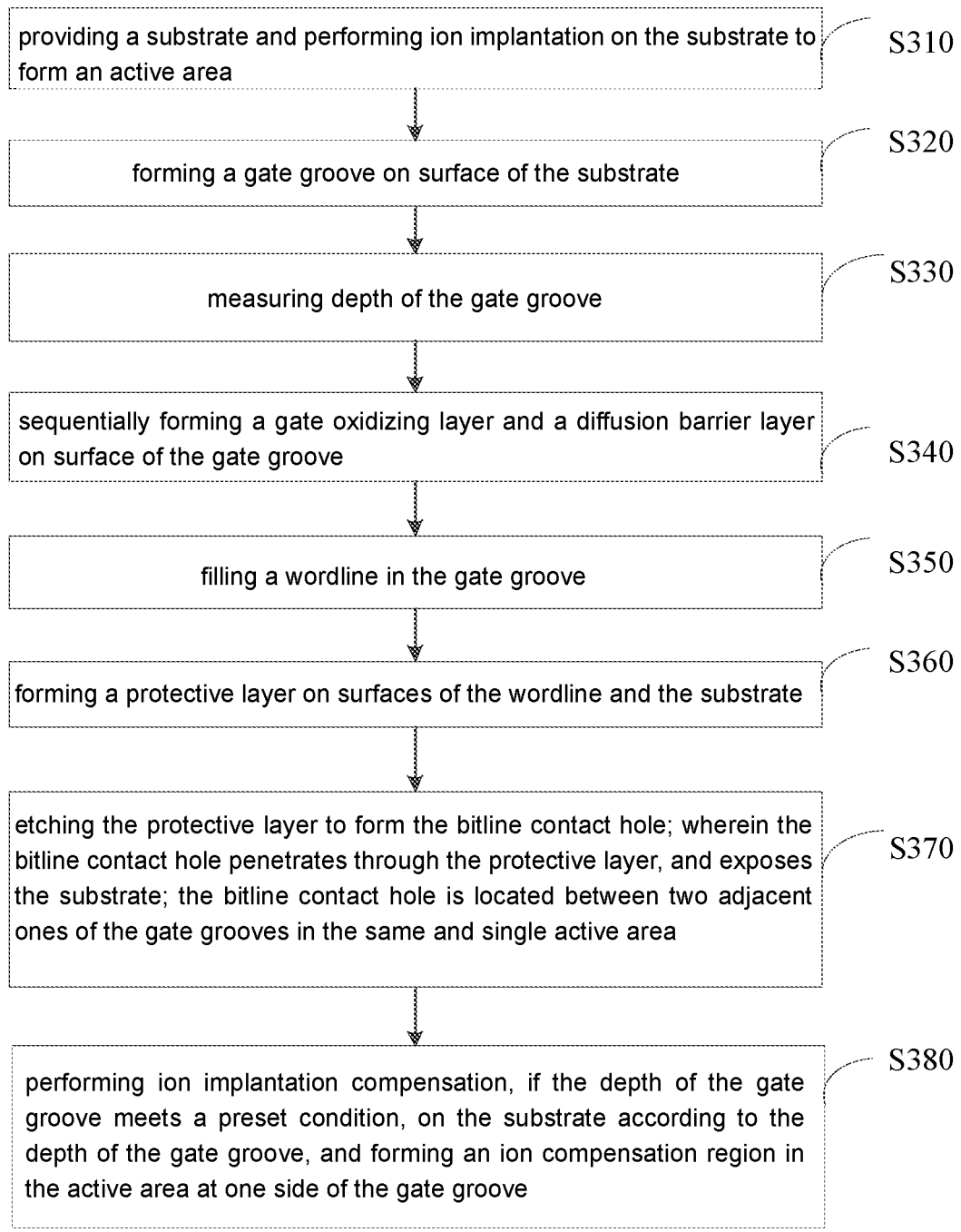
FIG. 17 is a flowchart illustrating still another method of fabricating a semiconductor structure provided in an embodiment of the present application.

Additionally, FIG. 17 is a flowchart illustrating still another method of fabricating a semiconductor structure provided in an embodiment of the present application. As shown in FIG. 17, the following specific steps are included.

after measuring the depth of the gate groove, S310: providing a substrate and performing ion implantation on the substrate to form an active area.

S320: forming a gate groove on surface of the substrate.

S330: measuring depth of the gate groove.

S340: sequentially forming a gate oxidizing layer and a diffusion barrier layer on surface of the gate groove.

S350: filling a wordline in the gate groove.

S360: forming a protective layer on surface of the wordline and surface of the substrate.

S370: etching the protective layer to form the bitline contact hole; wherein the bitline contact hole penetrates through the protective layer, and exposes the substrate; the bitline contact hole is located between two adjacent ones of the gate grooves in the same and single active area.

Figure 18:
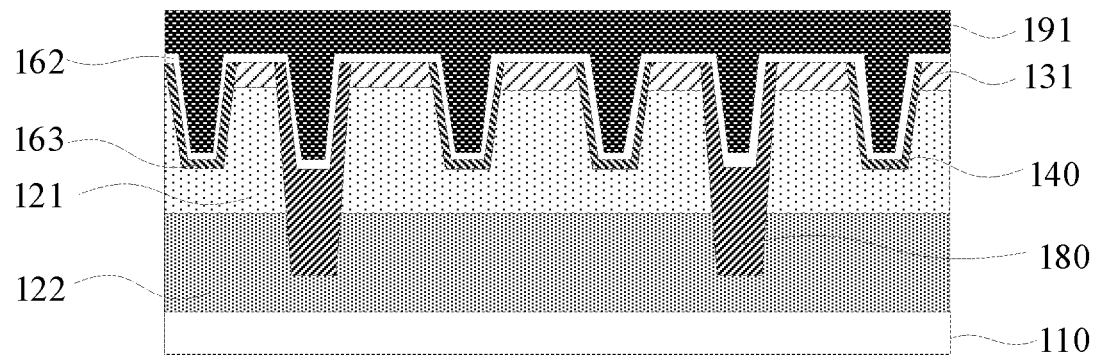
FIG. 18 is a diagram schematically illustrating the process of a method of fabricating wordlines provided in an embodiment of the present application.

Exemplarily, FIG. 18 is a diagram schematically illustrating the process of a method of fabricating wordlines provided in an embodiment of the present application. Referring to FIGS. 10 and 18, thermal oxidation process or other deposition process can be used to form a gate oxidizing layer 160 on the surface of the gate groove, the material of the gate oxidizing layer 160 is generally selected from silicon oxide; a diffusion barrier layer 162 is formed on the side of the gate oxidizing layer 160 departing from the substrate 110 and on the surface of the shallow trench isolation structure 180, the material of the diffusion barrier layer 162 includes, but is not restricted to, titanium nitride or tantalum nitride, for reducing or avoiding diffusion between the wordline 190 and the substrate 110. A metal layer 191 is deposited and formed on the surface of the diffusion barrier layer 162, and the metal layer 191 can be selected from tungsten or other frequently used wordline materials.

Referring to FIGS. 9 and 18, the metal layer 191 is etched back, so that the upper surface of the metal layer 191 is lower than the upper surface of the substrate 110, that is to say, the wordline 190 is formed in the gate groove 140 and the shallow trench isolation structure 180, and the diffusion barrier layer 162 outside of the gate groove 140 and the shallow trench isolation structure 180 is also removed during the etching back process; a protective layer 161 is subsequently formed on the surface of the wordline 190, and this protective layer 161 is used to protect the wordline 190, and is preferably of a silicon nitride material.

Referring to FIG. 10, bitline contact holes 170 are etched and formed on the surface of the protective layer 161; the bitline contact holes 170 penetrate through the protective layer 161 and expose the substrate 110, whereby compensation ions can be implanted in the substrate 110 through the bitline contact holes 170, so as to diffuse in the active area 121 to form an ion compensation region 150.

S380: performing ion implantation compensation, if the depth of the gate groove meets a preset condition, on the substrate according to the depth of the gate groove, and forming an ion compensation region in the active area at one side of the gate groove.

Based on the same application conception, an embodiment of the present application further provides a semiconductor structure, which is fabricated via a method of fabricating a semiconductor structure according to any embodiment of the present application, and possesses the corresponding advantageous effects as possessed by the method.

Another embodiment of the present application provides a semiconductor structure, whose structure is as shown in FIG. 5, the semiconductor structure 100 comprises a substrate 110, a gate groove 140, and an ion compensation region 150. An active area 121 is disposed in the substrate 110, and the ion compensation region 150 is located in the active area 121 at one side of the gate groove 140 whose depth h meets a preset condition.

In the embodiment of the present application, ion implantation compensation is performed on the substrate 110 according to the depth h of the gate groove 140, and an ion compensation region 150 is formed in the active area 121 at one side of the gate groove 140; the ion compensation region 150 exerts control function on the density of moveable charges in source and drain areas, so as to make it more difficult for source and drain areas at the two sides of the gate groove 140 to be conducted, thus enhancing the threshold voltage, compensating reduction in threshold voltage caused by an unduly shallow depth h of the gate groove 140, avoiding deterioration of performance of the semiconductor structure caused by variation in the depth h of the gate groove 140, and improving performance of the semiconductor memory.

In addition, still another embodiment of the present application provides still another semiconductor structure, whose structure is as shown in FIG. 10, the semiconductor structure 100 further comprises a bitline contact hole 170, whose vertical projection onto the substrate 110 at least partially overlaps with vertical projection of the ion compensation region 150 onto the substrate 110. Since ion implantation should be performed on the surface of the substrate 110, whereby it is ensured that the implanted ions form the ion compensation region 150 on the substrate 110, so it is required to utilize such process as etching to expose the substrate 110, so as to perform implantation of the compensation ions; in the embodiments of the present application compensation ion implantation is performed through the bitline contact holes 170, and no additional process is required, thus simplifying the process.

Additionally, referring to FIGS. 5 and 10 in combination, the semiconductor structure 100 further comprises shallow trench isolation structures 180, between two adjacent ones of the shallow trench isolation structures 180 is disposed a gate groove 140, and the depth h of the gate groove 140 is less than the depth Z of the shallow trench isolation structure 180. The semiconductor structure 100 further comprises a gate oxidizing layer 163 and a diffusion barrier layer 162 disposed on surfaces of the gate groove and the shallow trench isolation structure 180; a wordline 190 disposed in the gate groove 140 and the shallow trench isolation structure 180; and a protective layer 161 disposed on surface of the wordline 190, wherein bitline contact holes 170 penetrate through the protective layer 161 and expose the substrate 110.

Based on the same application conception, an embodiment of the present application further provides a semiconductor memory, which comprises a semiconductor structure provided by any embodiment of the present application, and possesses the corresponding functions and advantageous effects as possessed by the semiconductor structure.

Figure 19:
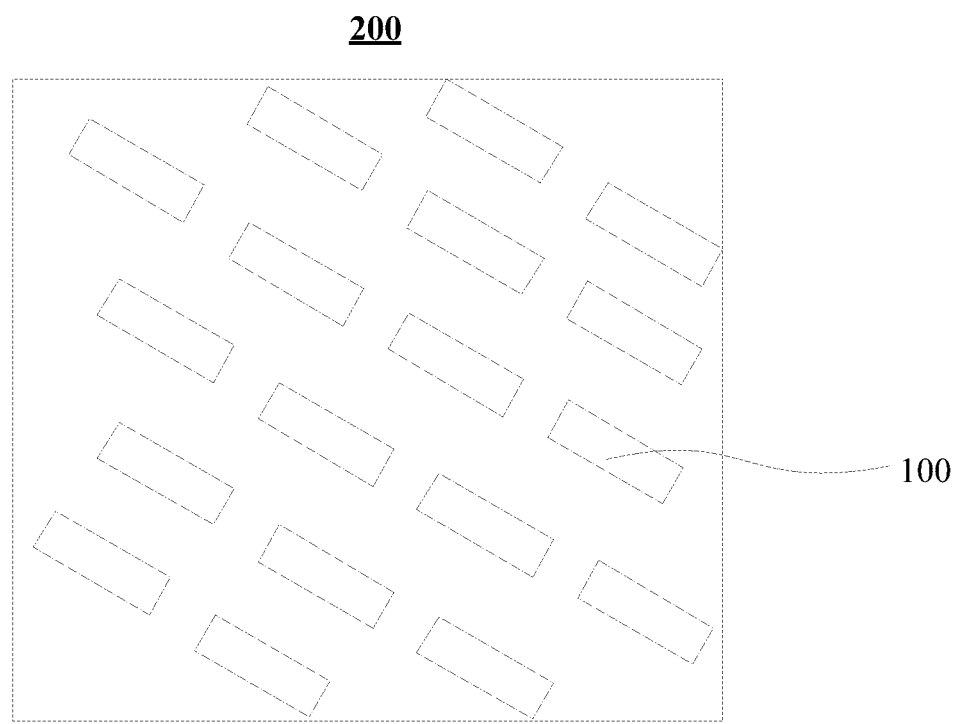
FIG. 19 is a diagram schematically illustrating a semiconductor memory provided in an embodiment of the present application.

FIG. 19 is a diagram schematically illustrating a semiconductor memory provided in another embodiment of the present application. As shown in FIG. 19, the semiconductor memory 200 comprises a plurality of semiconductor structures 100.

The semiconductor memory 200 provided by this embodiment of the present application possesses the advantageous effects possessed by the semiconductor structures 100 recited in the foregoing embodiments, while no repetition is made here.

The above description is merely directed to preferred embodiments of and technical principles employed by the present application. The present application is not restricted to the specific embodiments described herein, and various apparent variations, readjustments and substitutions makeable by person skilled in the art do not depart from the protection scope of the present application. Accordingly, although the present application is described in greater detail with reference to the aforementioned embodiments, the present application is not restricted to the aforementioned embodiments, as other equivalently effective embodiments not departing from the conception of the present application are also included, and the scope of the present application is decided by the scope of the appended claims.

What is claimed is:

1. A semiconductor structure, comprising:
   a substrate, a gate groove, and an ion compensation region; and
   an active area, disposed in the substrate; wherein the ion compensation region is located in the active area at one side of the gate groove;
   wherein the depth of the gate groove is less than a target depth, and that an absolute value of the difference between the depth of the gate groove and the target depth is greater than a threshold standard deviation;
   wherein the threshold standard deviation is determined according to a result of statistics about depths of plural gate grooves made with the target depth as a processing parameter.

2. The semiconductor structure according to claim 1, further comprising a bitline contact hole, whose vertical projection onto the substrate at least partially overlaps with vertical projection of the ion compensation region onto the substrate.

3. The semiconductor structure according to claim 2, further comprising a shallow trench isolation structure, which is located at surface of the substrate and separates the active area into plural blocks; wherein depth of the gate groove is less than depth of the shallow trench isolation structure.

4. The semiconductor structure according to claim 3, wherein the gate groove is located between two adjacent ones of the shallow trench isolation structures.

5. The semiconductor structure according to claim 3, further comprising:
   a gate oxidizing layer and a diffusion barrier layer disposed on surface of the gate groove;
   a wordline disposed in the gate groove; and
   a protective layer disposed on surfaces of the wordline and the substrate; wherein the bitline contact hole penetrates through the protective layer and exposes the substrate, and the bitline contact hole is located between two adjacent ones of the gate grooves in the same and single active area.

\* \* \* \* \*